(12) United States Patent
Chen et al.

(10) Patent No.: US 7,031,377 B2
(45) Date of Patent: Apr. 18, 2006

(54) RECEIVER AND LOW POWER DIGITAL FILTER THEREFOR

(75) Inventors: Feng Chen, Bethlehem, PA (US); Jiancheng Mo, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 734 days.

(21) Appl. No.: 09/772,093

(22) Filed: Jan. 26, 2001

(65) Prior Publication Data
US 2002/0141490 A1   Oct. 3, 2002

(51) Int. Cl.
*H04B 1/69* (2006.01)

(52) U.S. Cl. .............. 375/152; 375/143; 375/153; 375/343

(58) Field of Classification Search ........ 375/143, 375/147, 150–153, 207, 343; 370/342, 335; 341/161; 708/422
See application file for complete search history.

(56) References Cited

U.S. PATENT DOCUMENTS

| | | | |
|---|---|---|---|
| 5,903,595 A | 5/1999 | Suzuki et al. ............... 375/207 |
| 6,044,105 A * | 3/2000 | Gronemeyer ............... 375/152 |
| 6,075,807 A | 6/2000 | Warren et al. ............... 375/143 |
| 6,169,771 B1 * | 1/2001 | Shou et al. .................. 375/343 |
| 6,229,472 B1 * | 5/2001 | Nishida ...................... 341/161 |
| 6,366,605 B1 * | 4/2002 | Schilling .................... 375/147 |
| 6,625,205 B1 * | 9/2003 | Zhou et al. ................. 375/153 |
| 6,661,833 B1 * | 12/2003 | Black et al. ................. 375/147 |

\* cited by examiner

*Primary Examiner*—Khai Tran
*Assistant Examiner*—Edith Chang

(57) ABSTRACT

A digital filter or a receiver including a digital filter having at least two multiple stage shift registers. A plurality of multipliers corresponding in number to the number of stages in the at least two multiple stage shift registers receive as a first input an output from a corresponding stage of the at least two multiple stage shift registers. A tap weight shifter is coupled to a tap weight source to receive tap weights. The tap weight shifter is coupled to provide a second input to each multiplier. Each multiplier produces an output that is the product of inputs thereto. An adder sums the multiplier outputs to provide a sum output. The tap weight shifter then circularly shifts the tap weights and another multiply-add operation occurs. Several shift/multiply/add cycles may occur before data is again shifted into the at least two multiple stage shift registers, and another multiply-add operation occurs.

37 Claims, 4 Drawing Sheets

RECEIVER AND LOW POWER DIGITAL FILTER THEREFOR

TECHNICAL FIELD

This invention relates to digital communication technology, and in particular to a filter for correlating known coefficients with a data sequence.

BACKGROUND OF THE INVENTION

In a spread spectrum communication system, the transmitted signal is spread over a frequency band that is significantly wider than the minimum bandwidth required to transmit the signal. By spreading transmission bandwidth across a broader bandwidth than minimally required, power levels at any given frequency within the bandwidth are significantly reduced. In one type of spread spectrum communication system, known as a direct sequence code division multiple access (CDMA) modulation system, a radio frequency (RF) carrier is modulated by a known digital code sequence referred to as a spreading code. The spreading code has a bit rate, or chipping rate, that is much higher than a clock rate of the underlying information signal. The RF carrier may be binary or quadrature modulated by one or more data streams. The data streams have one phase when the spreading code represents a data "one" or "high" and a predetermined phase shift (e.g., 180° for binary modulation and 90° for quadrature modulation) when the spreading code represents a data "zero" or "low". These types of modulation techniques are commonly referred to as binary shift key modulation (BPSK) and quadrature shift key modulation (QPSK), respectively.

To retrieve the data encoded in a transmitted signal upon being received as a received signal, CDMA systems despread received signal samples with the same spreading code as was used to encode the data. CDMA systems employ a filter for correlating the spreading code with received signal samples to determine the received signal samples in a multi-chip data sequence.

A low power consuming analog filter for CDMA systems is disclosed in Low-Power Consuming Analog-Type Matched Filter for DS-CDMA Mobile Radio, by M. Sawahashi, F. Adachi, G. Shou, and C. Zhou, published in IEICE Transactions Fundamentals, Vol. E79-A, No. 12, December 1996, pp2071–2077.

In one known matched filter, multi-bit received signal samples are clocked through a delay line comprised of a plurality of delay stages, such as a shift register. The delays in the shift register are of a multiple bit width sufficient to accommodate the received signal samples. Each of the delay stages provides a delay of less than one-half of the period of the spreading code clock, or chipping rate, to satisfy the Nyquist sampling theorem. The signal samples propagate down the delay line through a series of successive shifts at a rate corresponding to the chipping rate. Taps at each delay stage provide the delayed signal samples for multiplication by respective tap weights associated with the respective delay stages to produce product terms, which when summed, provide the filter output. The tap weights represent the spreading code used to encode information on the transmission signal prior to being transmitted. The filter output is a correlation of the received signal samples with the spreading code represented by the tap weights.

Each time a new received signal sample is clocked into the delay line, each stage of the delay line is clocked to shift the previously received signal samples along the delay line by one delay stage. A received signal sample that has shifted completely through the delay line is shifted out of the delay line, as is known in the art. A shortcoming of this straightforward implementation is the amount of power consumed by the delay line due to each stage of the delay line being clocked each time a new received signal sample is introduced into the delay line.

U.S. Pat. No. 6,075,807 teaches a digital matched filter for CDMA systems that include a digital delay line having a plurality of successive delay stages adapted to receive a digital signal and propagate the digital signal therethrough at a fixed rate. A correlator is coupled to the delay line to correlate the digital signal to a predefined spreading code to provide a correlation signal representing a degree of correlation of the digital signal to the spreading code. A window logic unit is coupled to the correlator to enable operation of the correlator only during successive discrete time periods of the correlation signal corresponding to a high degree of correlation of the digital signal to the spreading code.

SUMMARY OF THE INVENTION

In accordance with the invention or a digital filter or a receiver including a digital filter includes at least two multiple stage shift registers. A plurality of multipliers corresponding in number to the number of stages in the at least two multiple stage shift registers receive as a first input an output from a corresponding stage of the at least two multiple stage shift registers. A tap weight shifter is coupled to a tap weight source to receive tap weights. The tap weight shifter is coupled to provide a second input to each multiplier. Each multiplier produces an output that is the product of inputs thereto. An adder sums the multiplier outputs to provide a sum output. The tap weight shifter then circularly shifts the tap weights and another multiply-add operation occurs. Several shift/multiply/add cycles may occur before data is again shifted into the at least two multiple stage shift registers, and another multiply-add operation occurs.

DETAILED DESCRIPTION

Figure 1:
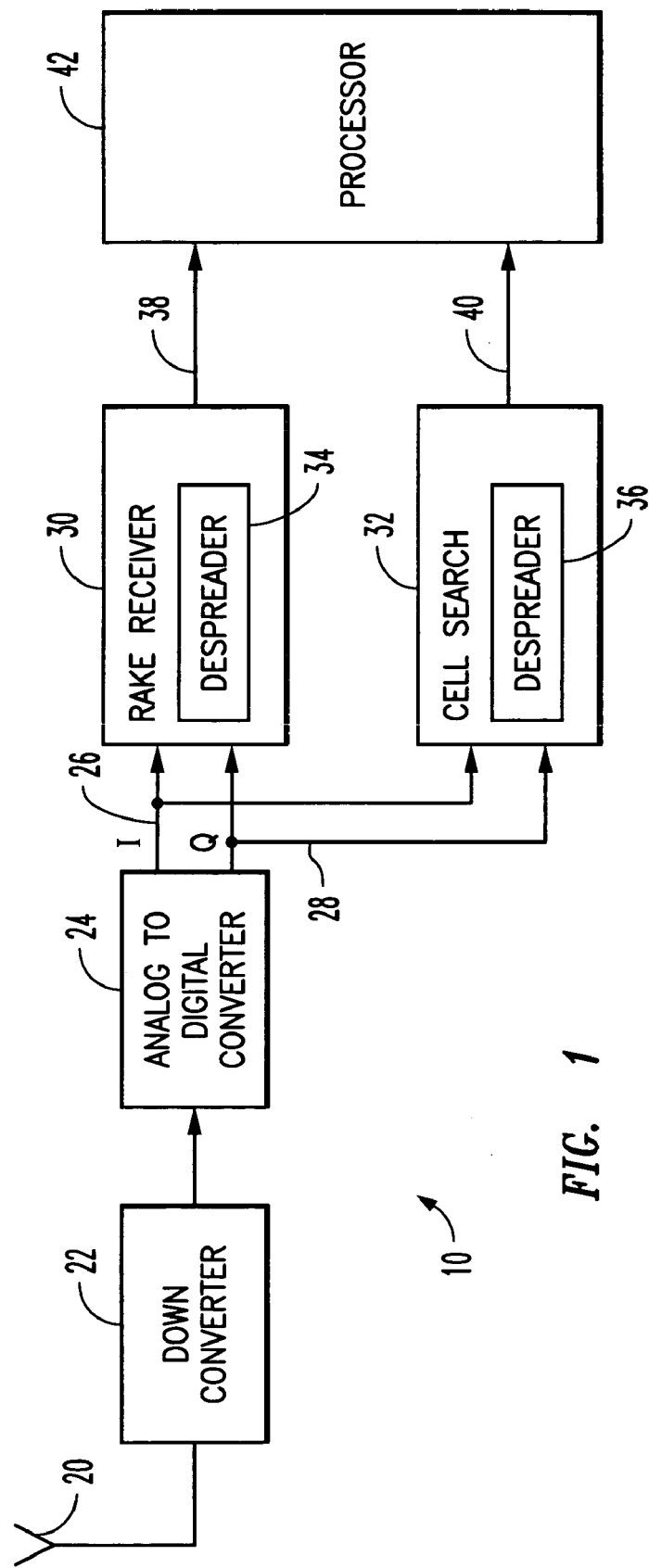
FIG. 1 is a simplified block diagram of a receiver including a digital filter for despreading a received signal in accordance with the present invention.

FIG. 1 represents a receiver 10 employing an illustrative embodiment of the invention. Receiver 10 may be a handset, a base station, or any receiver employing a matched digital filter. Receiver 10 receives a radio frequency (RF) signal on antenna 20 and down converts the RF signal to a baseband signal by multiplying the received signal by a carrier frequency generated by a local oscillator. The down-converted signal is then converted from an analog signal to a multi-bit digital signal by an analog-to-digital converter 24. The digital signal may be filtered by a low pass filter to remove aliasing noise, resulting in multi-bit received digital signal samples. The received digital signal samples are changed if necessary to the form of a multi-bit digital signal having a chipping rate of the spreading code originally used to modulate the digital information of the signal. The received digital signal samples may additionally include two components, an I channel component 26 and a Q channel component 28. The I and Q channel signal components may be processed in a number of functions, such as in a rake receiver 30 including a despreader 34 to demodulate the received digital signal samples, and in a cell search circuit 32 including a despreader 36 to provide synchronized tracking, as are mentioned below. The correlation information produced by the rake receiver and cell search may be further processed such as by processor 42.

Figure 2:
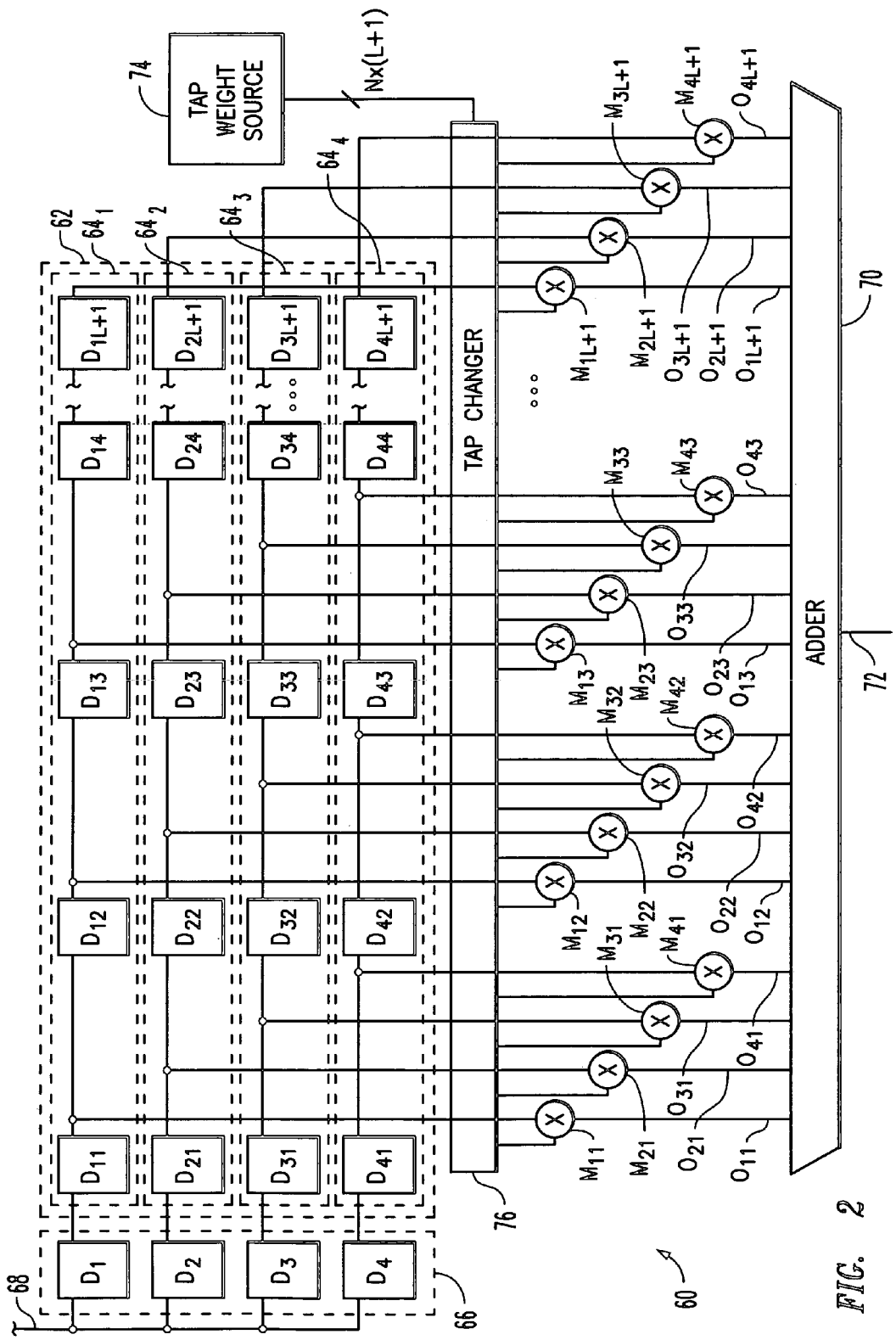
FIG. 2 is a simplified block diagram of a low power digital filter for despreading a received signal in accordance with the present invention that may be employed in the receiver of FIG. 1.

An illustrative embodiment of a digital matched filter 60 that can be implemented in software, hardware such as an integrated circuit, or a combination of software or hardware, is shown in FIG. 2. The integrated circuit may be, for example, be a macrocell in an application specific integrated circuit, a microprocessor, a microcontroller, or a digital signal processor. Defining T as the number of taps in a straight-forward implementation, as described above, of a digital filter. The T taps are factored into a product of N and L, where N×L=T, and N and L are any integers that divide into T. Matched filter 60 is comprised of T+N multiple bit delays. The use of the N additional delays (as compared to the straight-forward implementation) will become clear below. As will be explained below, the invention can accommodate a number of taps that can not be divided into a product of two integers.

An array 62 of multiple bit delays $D_{11}$ through $D_{N\,L+1}$ are arranged as an N×L+1 array, or equivalent, illustratively having N rows and L+1 columns. In the illustrated embodiment, N is 4 although the invention is not limited thereto. The bit-width of each delay depends on system design, such as the number of bits in the output of analog-to-digital converter 24. Each row of delays in array 62 forms a row shift register $64_1$ through $64_N$ (in the illustrated embodiment, $64_1$ through $64_4$) connected as shown. Each row shift register, when clocked, shifts or transfers data from the output of each stage to a "downstream" stage for storage therein, as is known in the art. The clocking is not illustrated in FIG. 2; one skilled in the art would understand how to clock the delays.

Digital data samples, each representing a sample at a sample instant, received on line 68 are clocked into registers of buffer 66 to provide a parallel output from buffer 66 of N digital signal samples. Buffer 66 is comprised of N registers $D_1$ through $D_N$ (in the illustrated embodiment, four registers $D_1$ through $D_4$), which in a preferred embodiment are of the same, or greater, bit width as the bit width of delays $D_{11}$ through $D_{N\,L+1}$. The output of registers $D_1$ through $D_N$ of buffer 66 are coupled as inputs to respective shift registers $64_1$ through $64_N$ as shown in FIG. 2. Each of shift registers $64_1$ through $64_N$ is connected to receive as an input an output from a corresponding register $D_1$ through $D_N$ of buffer 66. In one embodiment, the digital data samples held in buffer 66 are not accessible to be a multiplier or multiplicand, and while held in buffer 66 do not contribute to an output from multiplier 60.

The output of each multiple bit delay $D_{11}$ through $D_{N\,L+1}$ is coupled as a multiplicand input to a respective multiplier $M_{11}$ through $M_{N\,L+1}$ (in the illustrated embodiment, $M_{11}$ through $M_{4\,L+1}$) as shown. A tap weight coefficient is provided as the multiplier input to each of multipliers $M_{11}$ through $M_{N\,L+1}$. In a preferred embodiment, the tap weight coefficients are binary and may take on the values of a logic zero or a logic one. Since in the preferred embodiment, the tap weight coefficients are single bits that are either a one or a zero, a multiplication operation per se does not occur but rather the tap weight coefficients determine whether the output from a corresponding multiple bit delay contributes to sum 72 or does not contribute to sum 72 produced by adder 70.

In a CDMA application, coefficients $C_0$ through $C_{T-1}$ are one bit wide tap weights representing the spreading code. However, the invention is not limited to one bit wide tap weights. Furthermore, not all tap weights must be of the same bit width. In non-CDMA applications, coefficients $C_0$ through $C_{T-1}$ may be of a bit width of greater than one bit, but typically be of a bit width less than or equal to the bit width of delays $D_{11}$ through $D_{N\,L+1}$, or less than or equal to the bit width of the digital signal samples. In applications where the tap weights are greater than one bit in width, a multiplication may occur to generate the outputs $O_{11}$ through $O_{N\,L+1}$.

Each multiplier $M_{11}$ through $M_{N\,L+1}$ produces a corresponding output $O_{11}$ through $O_{N\,L+1}$ that is the product of the two inputs to each respective multiplier. The outputs $O_{11}$ through $O_{N\,L+1}$ (in the illustrated embodiment $O_{11}$ through $O_{4\,L+1}$) from corresponding multipliers $M_{11}$ through $M_{N\,L+1}$ are provided as inputs to adder 70. Outputs $O_{11}$ through $O_{N\,L+1}$ are combined by adder 70 to form sum 72, which is the output from adder 70. Sum 72 is the correlation of the spreading code represented by coefficients $C_0$ through $C_{T-1}$ with samples of the received signal. The magnitude of the correlation determines whether there is meaningful information to be extracted from the received signal samples. In a CDMA system, the correlation sum is used inter alia for synchronization, capture, synchronized tracking, and data demodulation. The correlation sum may be used for other purposes in non-CDMA applications.

Coefficients $C_0$ through $C_{T-1}$ may be provided by any technique to achieve the inventive digital filter 60. For example, the coefficients $C_0$ through $C_{T-1}$ may be provided to tap changer 76 from a tap weight source 74, such as but not limited to random access memory (RAM), read only memory (ROM), or a processor.

In operation, digital filter 60 illustrated in FIG. 2 receives digital signal samples, for example from an analog-to-digital converter 24, on line 68. The digital signal samples are clocked at the spreading code clock rate into the registers $D_1$ through $D_N$ of buffer 66. In a preferred embodiment, the digital data samples are individually clocked into registers $D_1$ through $D_4$ of buffer 66. For example, a digital signal sample is clocked into register $D_4$. The next digital signal sample is clocked into register $D_3$. The next digital signal sample is clocked into register $D_2$, and the next digital signal sample is clocked into register $D_1$. Each register D1 through $D_4$ provides at its output the digital signal sample stored therein. Once registers $D_1$ through $D_4$ are updated with digital signal samples, the row shift registers are clocked to shift the digital signal samples from the output of registers $D_1$ through $D_4$ of buffer 66 into respective delays of the corresponding row shift registers $64_1$, $64_2$, $64_3$, and $64_4$. In this manner, after the row shift registers are clocked L+1 times, all of the delays $D_{11}$ through $D_{N\,L+1}$ are filled with valid digital signal samples. As is known in the art, until all of the delays are updated to contain valid digital signal samples, the correlation sum 72 may be discarded. Furthermore, while the buffer of N registers or delays, $D_1$ through $D_N$, is clocked at the spreading clock frequency, the row shift registers $64_1$ through $64_4$ are clocked at a lower rate that is 1/N times the spreading clock frequency. With this reduction in the frequency of clocking the delay stages of the row shift registers there is a concomitant reduction in power consumption.

As the digital signal samples are shifted into buffer 66, thence into row shift registers $64_1$, $64_2$, $64_3$, and $64_4$, taps at the output of each delay $D_{11}$ through $D_{N\,L+1}$ provide the digital signal samples as multiplier inputs to multipliers $M_{11}$ through $M_{N\,L+1}$. Tap weight coefficients, $C_0$ through $C_{T-1}$, such as from tap weight source 74, are provided to tap changer 76 thence by tap changer 76 as the multiplicand input to multipliers $M_{11}$, through $M_{N\,L+1}$. The product outputs $O_{11}$ through $O_{N\,L+1}$ produced by the multipliers are summed in adder 70 to produce the correlation sum 72 for one sample instant.

In accordance with the invention, the coefficients $C_0$ through $C_{T-1}$ are shifted by tap changer 76 in coordination with the digital signal samples being shifted from buffer 66 through registers $D_{11}$ through $D_{N\,L+1}$ so that the appropriate product terms (outputs $O_{11}$ through $O_{N\,L+1}$) are generated to contribute to a correlation sum at each sample instant. The tap changer shifts the coefficients $C_0$ through $C_{T-1}$ at the spreading clock frequency. The row shift registers $64_1$, $64_2$, $64_3$, and $64_4$ shift the digital data samples at a clock rate that is 1/N times the spreading clock frequency. Since the coefficients in a preferred embodiment are one bit wide, the power required to shift the coefficients is relatively small by comparison to shifting all of the digital signal samples at the spreading clock frequency. Even when the coefficients have a bit width greater than one bit, there will be a power savings. For example, in a CDMA system, the tap weight coefficients may be one bit wide while the digital data samples as well as the registers of the row shift registers are eight bits wide.

In order to achieve the same correlation sum as the correlation sum obtained in the straight-forward filter technique, the number of delay stages is increased to T+N from T. The number of taps, multipliers, and inputs to adder 70 are also increased by N as compared to the straight-forward filter technique. The tap weight coefficients, $C_0$ through $C_{T-1}$, are provided to and shifted into tap changer 76 from, for example, tap weight source 74. The spreading code tap weight coefficients are augmented with leading and trailing zeroes as illustrated in coefficient shift position 1 of Table 1 to form the augmented coefficients that are provided as the multiplicand input to multipliers $M_{11}$ through $M_{N\,L+1}$. Although Table 1 is prepared for the case N=4, one skilled in the art can determine the tap weight coefficient shift pattern, and the multiplier associated with each tap weight coefficient in the more general case.

pliers $M_{11}$ through $M_{N\,L+1}$, in addition to the product outputs $O_{11}$ through $O_{N\,L+1}$ being provided as inputs to adder 70, tap changer 76 is clocked to rotate the augmented coefficients. Tap changer 76 may include a circular shift register or combinational logic such that the augmented coefficients rotate through positions when tap changer 76 is clocked. Once tap weights are loaded into tap changer 76, the tap weights contribute to a correlation sum from the initial coefficient shift position, and tap changer 76 is clocked N−1 times to rotate the tap weights before the augmented coefficients are loaded from tap weight source 74 into tap changer 76 again, thereby being reset to the stored coefficients in coefficient shift position 1.

The effect on the augmented coefficients of tap changer 76 being clocked can be seen in the rows of Table 1. Row 1 represents the augmented coefficients as retrieved from memory. Upon clocking tap changer 76, each tap weight in row 1 of Table 1 representing coefficient shift position 1 is circularly shifted to the left. The tap weight in the left-most column associated with multiplier $M_{11}$ is shifted into the right-most column, to be associated with multiplier $M_{4\,L+1}$ in coefficient shift position 2 of Table 1. Row 2 represents the augmented coefficients after tap changer 76 is clocked once. Row 3 represents the augmented coefficients after tap changer 76 is again clocked. Row 4 represents the augmented coefficients after tap changer 76 is again clocked. The augmented coefficients are shifted N−1 times in tap changer 76, for a total number of N positions. In each position, the augmented coefficients are provided as respective multiplicands to multipliers $M_{11}$ through $M_{N\,L+1}$ in the correlation process. The shift pattern represented in Table 1 is coordinated with the sequence of clocking digital signal samples into buffer 66 and the physical arrangement of multipliers $M_{11}$ through $M_{N\,L+1}$ to assure the appropriate intermediate product terms, $O_{11}$ through $O_{N\,L+1}$, are generated to produce the correlation sum 72 at each sample instant.

Figure 3:
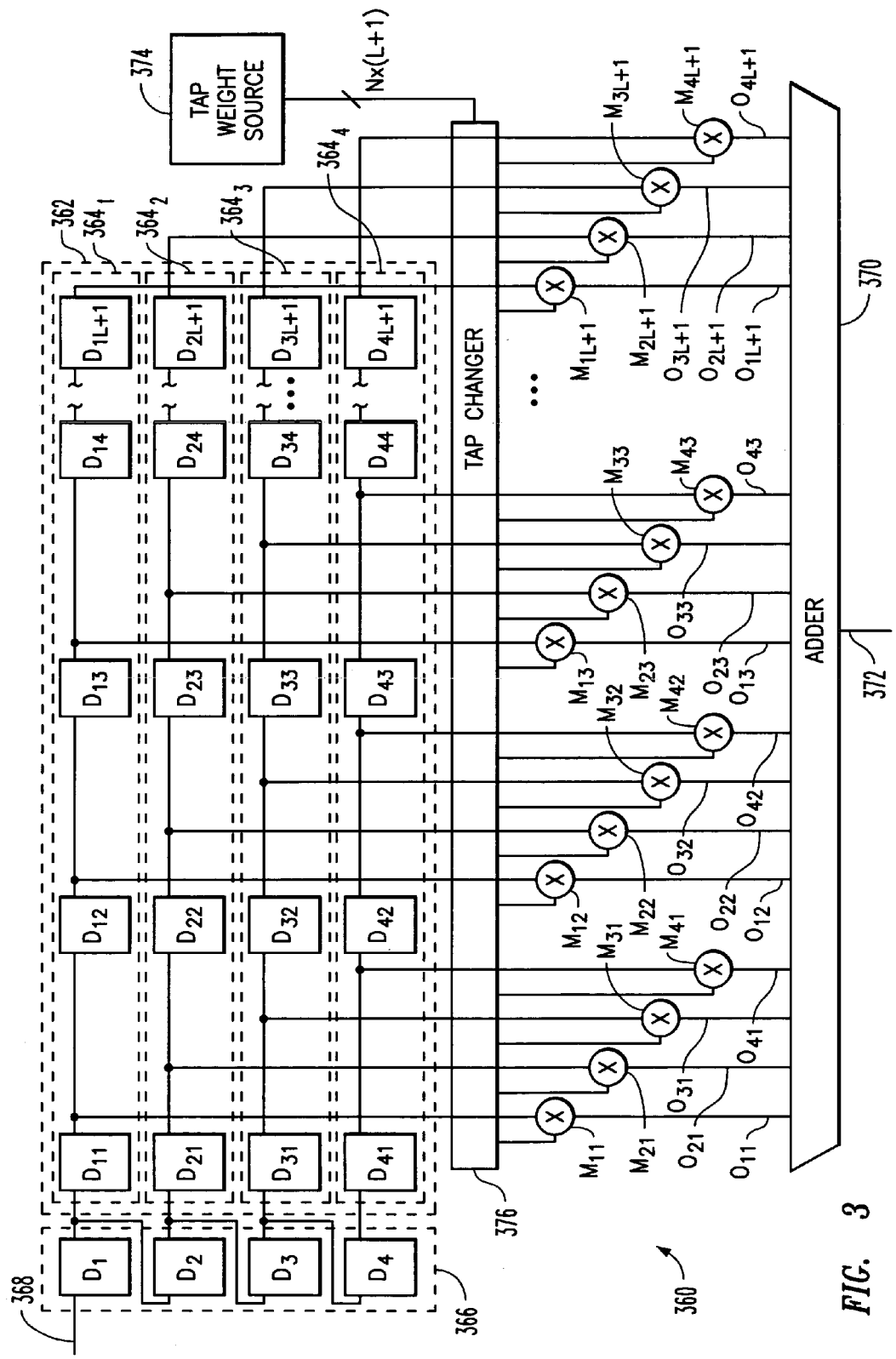
FIG. 3 is a simplified block diagram of an alternate embodiment low power digital filter for despreading a received signal in accordance with the present invention that may be employed in the receiver of FIG. 1.

An alternate illustrative embodiment digital matched filter 360 is shown in FIG. 3 that can be employed in a receiver and implemented in software, hardware, or some combination thereof. Elements in the embodiment illustrated in FIG. 3 having reference numerals similar to reference numerals of elements in the embodiment illustrated in FIG. 2 have a similar function. Buffer 366 is a serial input, parallel output buffer. In the alternate embodiment digital matched filter 360, digital signal samples are clocked into register $D_1$, and shifted through the registers of buffer 366 until each of the N buffer registers has been updated. With all of the registers $D_1$ through $D_N$ of buffer 366 updated with digital signal samples, the row shift registers $364_1$, $364_2$, $364_3$, and $364_4$ are clocked to shift the digital signal samples from registers $D_1$ through $D_N$ of buffer 366 into respective delays of the

TABLE 1

| Coefficient Shift Position | COEFFICIENTS | | | | | | | | | | | |
| --- | --- | --- | --- | --- | --- | --- | --- | --- | --- | --- | --- | --- |
| 1 | 0 | 0 | 0 | $C_0$ | $C_1$ | $C_2$ | ... | $C_{T-4}$ | $C_{T-3}$ | $C_{T-2}$ | $C_{T-1}$ | 0 |
| 2 | 0 | 0 | $C_0$ | $C_1$ | $C_2$ | $C_3$ | ... | $C_{T-3}$ | $C_{T-2}$ | $C_{T-1}$ | 0 | 0 |
| 3 | 0 | $C_0$ | $C_1$ | $C_2$ | $C_3$ | $C_4$ | ... | $C_{T-2}$ | $C_{T-1}$ | 0 | 0 | 0 |
| 4 | $C_0$ | $C_1$ | $C_2$ | $C_2$ | $C_3$ | $C_5$ | ... | $C_{T-1}$ | 0 | 0 | 0 | 0 |
| Multi-plier | $M_{11}$ | $M_{21}$ | $M_{31}$ | $M_{41}$ | $M_{12}$ | $M_{22}$ | ... | $M_{4L}$ | $M_{1L+1}$ | $M_{2L+1}$ | $M_{3L+1}$ | $M_{4L+1}$ |

Once a multiplication utilizing all of the coefficients in coefficient shift position 1 of Table 1 takes place in multicorresponding row shift registers $364_1$, $364_2$, $364_3$, and $364_4$. In this manner, after the row shift registers are clocked L+1 times, all of the delays $D_{11}$ through $D_{N\ L+1}$ in shift registers $364_1$, $364_2$, $364_3$, and $364_4$ are filled with valid digital signal samples. Furthermore, while each of the N registers of buffer 366, $D_1$ through $D_N$, is clocked at the spreading clock frequency, the row shift registers $364_1$ through $364_4$ are clocked at a lower rate that is 1/N times the spreading clock frequency. Filter 360 has much of the power consumption reduction of filter 60. In filter 360, there are N−1 more registers of buffer 366 clocked at the spreading clock frequency than in filter 60. With this reduction in the frequency of clocking the delay stages of the row shift registers there is a concomitant reduction in power consumption.

While the illustrative embodiments of the invention have been described with respect to a CDMA communication system, the invention is not limited to being used in CDMA systems. The invention may be employed in any filter application, and may be fabricated in an integrated circuit using any known technology.

While the illustrative embodiment of the invention has been described as filling the delay buffer starting with delay D4, and ending with delay D1, the invention is not limited thereto. Other sequences of filling the buffer are within the scope of the invention. Coordination between the sequence of filling registers of the buffer, augmenting the tap weights with leading and trailing zeroes, and circular shifting of the augmented tap weights is necessary to produce the appropriate products to sum.

The invention has application where the bit width of tap weight coefficients is less than the bit width of the digital signal samples. Since the coefficients in a preferred embodiment are one bit wide, the power required to shift the coefficients is relatively small by comparison to shifting all of the digital signal samples at the spreading clock frequency.

Figure 4:
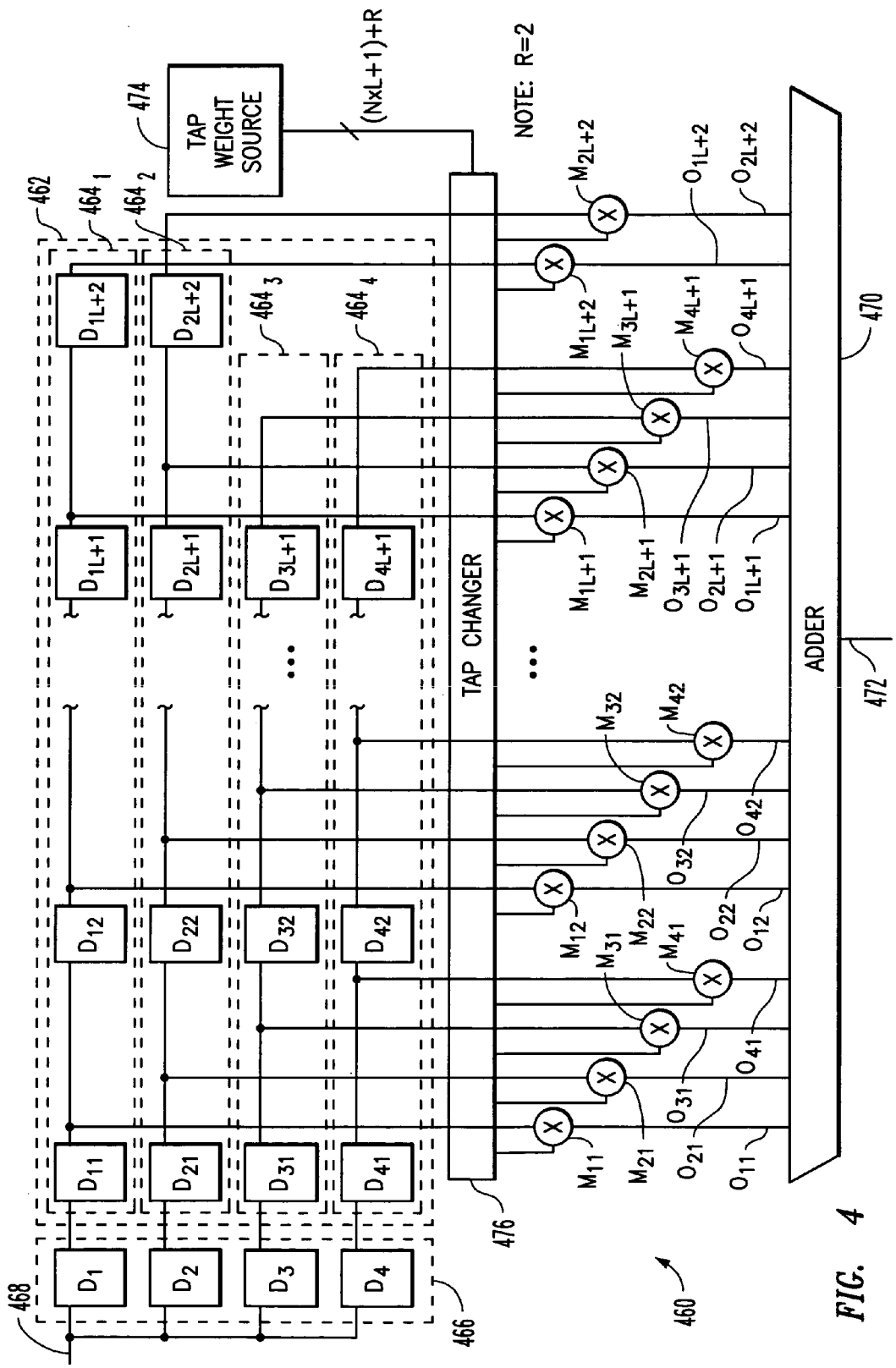
FIG. 4 is a simplified block diagram of yet another alternate embodiment low power digital filter in accordance with the present invention in which the number of taps is not a product of two integer numbers.

It was stated above that the T taps are factored into a product of N and L, where N×L=T, and N and L are any integers that divide into T, matched filter 60 is comprised of T+N multiple bit delays, and that the invention can accommodate a number of taps that can not be divided into a product of two integers. As can be seen from the right column of Table 1, in the illustrated embodiment, the tap weight of multiplier $M_{4\ L+1}$ is always zero. Thus, there is no contribution to the sum from multiplier $M_{4\ L+1}$, the multiplier can be eliminated, delay $D_{4\ L+1}$ can be eliminated, and there is no need to provide output $O_{4\ L+1}$ to adder 70. This departs from an array 62 of delays that is N×L+1. The number of delay stages in array 62 can be factored into N×L+1, with a remainder of R, where R<N. The R delays should be included in the shift registers such that there is no sample instant gap between the data samples in the shift registers. Where the R delays are in the array is dependent in part on the sequence of filling the buffer registers. In FIGS. 2 and 3, for example, if R registers were present, they would form the rightmost column of the array, and would fill in delay stages beginning from the top of the array as illustrated. An example of a digital filter in which the number of taps not a product of two integer numbers is illustrated in FIG. 4.

What is claimed is:

1. A digital filter, comprising:
   at least two multiple stage shift registers;
   a plurality of multipliers corresponding in number to the total number of stages in the at least two multiple stage shift registers, each multiplier receiving as a first input an output from a stage of the at least two multiple stage shift registers;
   a tap weight shifter coupled to a tap weight source to receive tap weights, the tap weight shifter coupled to provide a second input to each multiplier, the tap weight shifter capable of shifting tap weights, each multiplier producing an output corresponding to a product of the first and second inputs; and
   an adder for summing the multiplier outputs to provide a sum output, wherein:
   two or more sum outputs are generated by the adder between consecutive shiftings of new data into the at least two multiple stage shift registers; and
   no new data is shifted into any of the at least two multiple stage shift registers between generation of a first of the two or more sum outputs by the adder and a last of the two or more sum outputs by the adder.

2. A digital filter as recited in claim 1, further comprising:
   a multiplier stage buffer for receiving and storing digital samples, outputs from the multiple stage buffer being coupled to provide inputs to the at least two multiple stage shift registers.

3. A digital filter as recited in claim 2, wherein the multiple stage buffer is a serial-input, parallel-output buffer.

4. A digital filter as recited in claim 1, wherein the tap weights received by the tap weight shifter are one bit wide.

5. A digital filter as recited in claim 1, wherein the tap weights received by the tap weight shifter are more than one bit wide and the tap weights have a bit width that is no greater than a bit width of stages of the shift registers.

6. A digital filter as recited in claim 1, wherein the digital filter is implemented in software.

7. A digital filter as recited in claim 1, wherein the digital filter is implemented in an integrated circuit.

8. A digital filter as recited in claim 7, wherein the digital filter is implemented in an application specific integrated circuit.

9. A digital filter as recited in claim 7, wherein the digital filter is implemented in a digital signal processor.

10. A digital filter as recited in claim 7, wherein the digital filter is implemented in a microcontroller.

11. A digital filter as recited in claim 7, wherein the digital filter is implemented in a microprocessor.

12. A digital filter as recited in claim 1, further comprising the tap weight source from which to receive the tap weights.

13. A digital filter as recited in claim 12, wherein the tap weight source is random access memory.

14. A digital filter as recited in claim 12, wherein the tap weight source is read-only memory.

15. A digital filter as recited in claim 12, wherein the tap weight source is a processor.

16. A receiver including a digital filter comprising:
   at least two multiple stage shift registers;
   a plurality of multipliers corresponding in number to the total number of stages in the at least two multiple stage shift registers, each multiplier receiving as a first input an output from a stage of the at least two multiple stage shift registers:
   a tap weight shifter coupled to a tap weight source to receive tap weights, the tap weight shifter coupled to provide a second input to each multiplier, the tap weight shifter capable of shifting tap weights, each multiplier producing an output corresponding to a product of the first and second inputs; and
   an adder for summing the multiplier outputs to provide a sum output, wherein:
   two or more sum outputs are generated by the adder between consecutive shiftings of new data into the at least two multiple stage shift registers; and
   no new data is shifted into any of the at least two multiple stage shift registers between generation of a first of the two or more sum outputs by the adder and a last of the two or more sum outputs by the adder.

17. A receiver as recited in claim 16, further comprising:
a multiplier stage buffer for receiving and storing digital samples, outputs from the multiple stage buffer being coupled to provide inputs to the at least two multiple stage shift registers.

18. A receiver as recited in claim 17, wherein the multiple stage buffer is a serial-input, parallel-output buffer.

19. A receiver as recited in claim 16, wherein the tap weights received by the tap weight shifter are one bit wide.

20. A receiver as recited in claim 16, wherein the tap weights received by the tap weight shifter are more than one bit wide and the tap weights have a bit width that is no greater than a bit width of stages of the shift registers.

21. A receiver as recited in claim 16, further comprising the tap weight source from which to receive the tap weights.

22. A receiver as recited in claim 16, wherein the receiver is a handset.

23. A receiver as recited in claim 16, wherein the receiver is a base station.

24. A method of filtering digital data, comprising the steps of:
a. shifting digital data into first and second multiple stage shift registers;
b. multiplying an output from each stage of the first and second multiple stage shift registers by an associated, respective tap weight to produce a plurality of products;
c. combining the plurality of products to form a single sum;
d. circularly shifting the tap weights; and
e. repeating steps b and c at least once before step a is repeated.

25. A method of filtering digital data as recited in claim 24, further comprising the step of shifting digital data into registers of a buffer prior to shifting the digital data into first and second multiple stage shift registers.

26. A method of filtering data, comprising the steps of:
a. shifting data into N multiple stage shift registers, each of the N multiple stage shift registers having at least L stages, N and L being integers, N being greater than 2;
b. multiplying an output from each of the at least L stages of the N multiple stage shift registers by a corresponding tap weight to produce a plurality of products;
c. combining the plurality of products to form a single sum;
d. circularly shifting the tap weights;
e. repeating steps b, c, and d N−2 times before step a is repeated;
f. repeating steps b and c again before step a is repeated.

27. A method of filtering data as recited in claim 26, further comprising the steps of
following step f, repeating steps a through f.

28. A method of filtering data as recited in claim 26, further comprising the step of shifting N pieces of data into registers of a buffer for temporary storage prior to shifting the N pieces of data into respective ones of the N multiple stage shift registers.

29. A digital filter comprising:
N multiple-stage shift registers, N>1;
a tap changer adapted to store a configuration of tap weights;
a plurality of multiplying elements, each multiplying element adapted to (a) receive (i) a datum from a corresponding stage of a corresponding shift register and (ii) a corresponding tap weight from the tap changer and (b) generate an output corresponding to a product of the datum and the corresponding tap weight; and
an adder adapted to receive the output from each multiplying element and generate a sum corresponding to the sum of the products of all of the data in the N multiple-stage shift registers and the corresponding tap weights in the tap changer, wherein:
the adder is adapted to generate two or more different sums for each set of data stored in the N multiple-stage shift registers;
no new data is shifted into any of the N multiple-stage shift registers between generation of a first of the two or more different sums by the adder and a last of the two or more different sums by the adder; and
each different sum is based on a different configuration of tap weights in the tap changer.

30. The digital filter of claim 29, wherein:
the tap changer is a circular buffer; and
each different configuration of the tap weights is generated by circularly shifting the tap weights within the tap changer.

31. The digital filter of claim 30, further comprising a tap weight source adapted to reload an initial configuration of tap weights into the tap changer.

32. The digital filter of claim 31, wherein the tap weight source is adapted to reload the initial configuration of tap weights after N sums have been generated based on N different configurations of the tap weights.

33. The digital filter of claim 29, further comprising an input buffer adapted to parallelize an incoming serial data stream for input into the N multiple-stage shift registers, wherein each shift register is adapted to receive a corresponding portion of the incoming serial data stream.

34. The digital filter of claim 33, wherein the digital filter is adapted to generate N different sums based on N different configurations of the tap weights for each shift of parallelized data into the N multiple-stage shift registers.

35. The digital filter of claim 29, wherein the N multiple-stage shift registers do not all have the same number of stages.

36. The digital filter of claim 29, wherein the bit-width of each tap weight is smaller than the bit-width of each datum in the N multiple-stage shift registers.

37. A receiver including a digital filter, the digital filter comprising:
N multiple-stage shift registers, N>1;
a tap changer adapted to store a configuration of tap weights;
a plurality of multiplying elements, each multiplying element adapted to (a) receive (i) a datum from a corresponding stage of a corresponding shift register and (ii) a corresponding tap weight from the tap changer and (b) generate an output corresponding to a product of the datum and the corresponding tap weight; and
an adder adapted to receive an output from each multiplying element and generate a sum corresponding to the sum of the products of all of the data in the N multiple-stage shift registers and the corresponding tap weights in the tap changer, wherein:
the adder is adapted to generate two or more different sums for each set of data stored in the N multiple-stage shift registers;
no new data is shifted into any of the N multiple-stage shift registers between generation of a first of the two or more different sums by the adder and a last of the two or more different sums by the adder; and
each different sum is based on a different configuration of tap weights in the tap changer.

* * * * *